United States Patent [19]
Ishibashi et al.

[11] Patent Number: 6,030,708
[45] Date of Patent: Feb. 29, 2000

[54] TRANSPARENT SHIELDING MATERIAL FOR ELECTROMAGNETIC INTERFERENCE

[75] Inventors: Tatsuo Ishibashi; Kanji Suyama; Shuzo Okumura, all of Kyoto, Japan

[73] Assignee: Nissha Printing Co., Ltd., Kyoto-Fu, Japan

[21] Appl. No.: 08/739,047

[22] Filed: Oct. 28, 1996

[51] Int. Cl.⁷ .............................. B32B 5/02; B32B 5/14; B32B 7/02; B32B 31/14

[52] U.S. Cl. .................. 428/441; 428/442; 427/108; 427/164; 427/165; 427/168; 427/169; 427/202; 427/203; 427/205; 427/331; 427/404

[58] Field of Search ................................ 428/558, 559, 428/441, 442; 427/108, 164, 165, 168, 169, 202, 203, 205, 331, 404

[56] References Cited

U.S. PATENT DOCUMENTS

| | | | |
|---|---|---|---|
| 3,753,710 | 8/1973 | Jones et al. | 96/36.1 |
| 3,773,514 | 11/1973 | Fromson | 96/86 |
| 3,775,157 | 11/1973 | Fromson | 117/71 R |
| 3,839,037 | 10/1974 | Fromson | 96/35.1 |
| 3,874,879 | 4/1975 | Rasch | 96/87 A |
| 3,900,320 | 8/1975 | Rolker et al. | 96/35.1 |

*Primary Examiner*—Daniel J. Jenkins
*Attorney, Agent, or Firm*—Wenderoth, Lind & Ponack, L.L.P.

[57] ABSTRACT

A transparent material for shielding undesired electromagnetic waves, in which a black mesh region is formed in a hydrophilic transparent resin layer on a transparent substrate. The present invention thus provides a transparent material for shielding undesired electromagnetic waves, which comprises:

(a) a transparent substrate, (b) a hydrophilic transparent resin layer formed on the transparent substrate (a), which in certain areas contains metal particles finely dispersed therein to form a black region and in the other area does not contain metal particles, to form a transparent region, and (c) a metal layer formed on the black region in the hydrophilic transparent resin layer (b);

and a production method therefor.

11 Claims, 2 Drawing Sheets

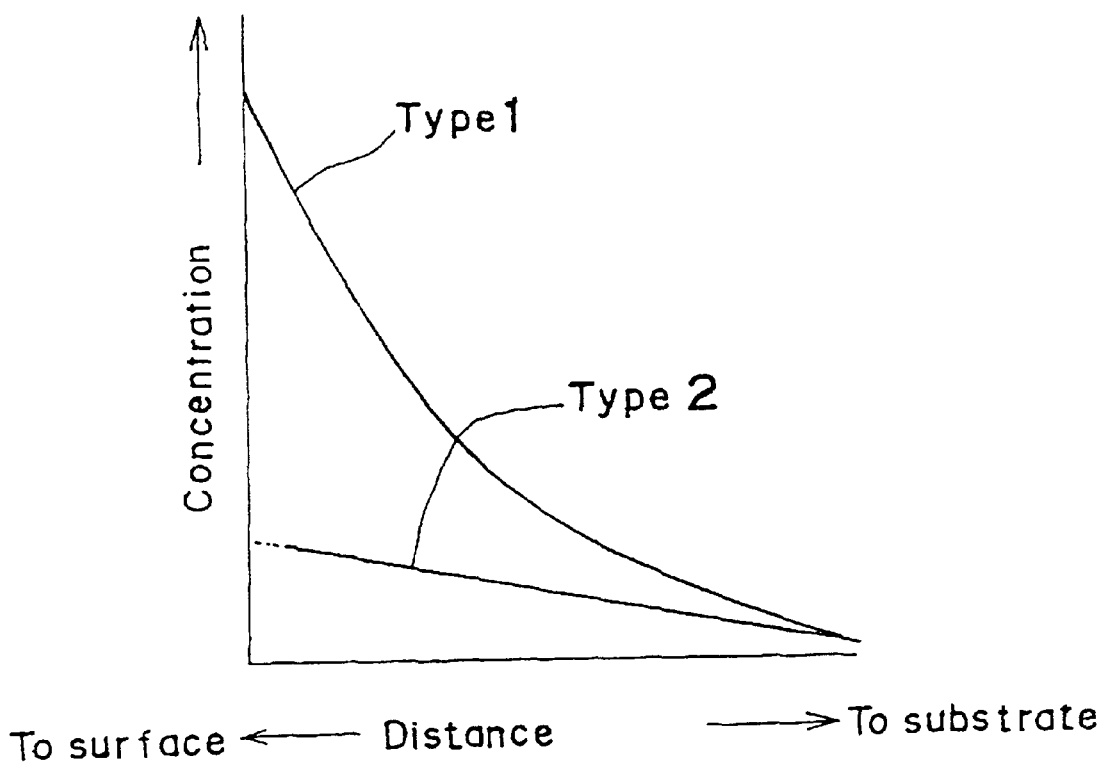

TRANSPARENT SHIELDING MATERIAL FOR ELECTROMAGNETIC INTERFERENCE

FIELD OF THE INVENTION

The present invention relates to a transparent shielding material for electromagnetic interference (EMI), which shields undesired electromagnetic waves generated from an electronic device. More particularly, the present invention relates to a material having high visibility and high shielding effects for EMI, which is employed in a front shield of an electronic display such as, a cathode ray tube (CRT), a liquid crystal display (LCD), a plasma display panel (PDP), and a field emitter display (FED), an examination instrument, a medical instrument and an information device.

BACKGROUND OF THE INVENTION

There have been two types of the materials which have both EMI shielding properties and light transmitting properties. One is a metal wire mesh, a fiber net with a metalized fiber surface deposited by electroless plating, and a laminate thereof on a transparent substrate such as glass and transparent resin (e.g. acrylic resin, polycarbonate). The other is a transparent substrate having thereon a transparent electroconductive coating such as SnO2, ITO, sputtered gold or other electroconductive oxides.

The former has a limitation in the selectiveness of the diameter or pitch of the mesh wires and fibers in order to transmit visible light, and results in less applicability to conventional use. In order to realize high contrast images and to reduce light reflection on the metal surface of the mesh, a black coating is additionally formed on the metal surface. The latter does not have good shielding effect and is difficult in application to conventional use. If the electroconductivity of the transparent coatings is made high, the light reflection from the coating surface increases, which reduces the visibility.

Therefore, it is desirable that the shielding materials for EMI have both light transparency and high shielding effects. In order to satisfy the requirement, it has been proposed to electrolessly deposit metal mesh on a transparent substrate. The electroless plating on a plastic substrate is one of well known technology in the field of the chemical industries. One of the typical methods of electroless plating onto the plastic substrate is described in U.S. Pat. No. 4,670,306, to Salem. The Salem patent suggests a method for the treatment of a substrate for electroless metal plating which includes the steps of applying onto a substrate a material selected for having adequate adherence to the substrate and for being suitably absorptive of an electroless plating catalyst. The substrate is immersed in a strong acid bath to render the surface hydrophilic, and to provide anchoring effect. However, the Salem patent also points out that the method of etching the substrate leads to too much surface roughness.

In order to avoid such direct etching with strong acid, a porous coating method is described in U.S. Pat. No. 4,244,789 to Coll-Polagos, which discloses that a substrate is coated with a hydrophilic composition and then treated with water to form a porous coating as an undercoating layer for 25 electroless plating. The electroless plating, however, has rarely been applied on a transparent substrate, because it is not necessary that the substrate to be electrolessly plated is transparent. Persons involved in this field always concentrate on the adhesiveness between the surface of the substrate and the electroless plated layer. Accordingly, the substrate for the electroless plating is believed to be translucent or non-transparent.

The production of a material having both light transparency and highly electromagnetic shielding properties is described in Japanese Kokai Publication Hei 5 (1993)-16281 which was filed on Feb. 28, 1991 by the present inventors. The process of the Japanese Publication comprises (i) forming a hydrophilic transparent resin layer on a transparent substrate, (ii) immersing it in a catalyst solution for electroless plating to disperse the catalyst into the hydrophilic transparent resin layer or the surface thereof, (iii) immersing the substrate in an electroless plating bath to conduct electroless plating, thus forming a metal layer on the hydrophilic transparent resin layer and forming metal particles in the hydrophilic transparent resin layer, (iv) forming a resist layer having a desired pattern on the metal layer, (v) removing the metal layer and the metal particles in the non-resist area by etching. Although the method is useful for producing the transparent shielding materials for EMI, the method does not always provide the transparent shielding material with high yield and is not a stable method. And also, the method has not paid any attention to the adhesion between transparent substrate and the hydrophilic transparent resin layer. It is therefore expected to stably reproduce the black region in the hydrophilic transparent resin layer on the transparent substrate by means of electroless plating.

SUMMARY OF THE INVENTION

The present invention provides a transparent material for shielding undesired electromagnetic wave, in which black mesh region is formed in a hydrophilic transparent resin layer on a transparent substrate. The present invention thus provides a transparent material for shielding undesired electromagnetic wave, which comprises:

(a) a transparent substrate, (b) a hydrophilic transparent resin layer formed on the transparent substrate (a), which contains in certain areas metal particles finely dispersed therein to form a black region and in the other area does not contain metal particles to form a transparent region, and (c) a metal layer formed on the black region in the hydrophilic transparent resin layer (b). The black region formed in the hydrophilic transparent resin layer contains very fine metal particles electrolessly deposited. The fine metal particles are distributed or dispersed in the hydrophilic transparent resin layer. The particle size and the state of distribution are important for forming the black region.

The present invention also provides a process for producing a transparent material for shielding undesired electromagnetic wave, which comprises:

(A) forming a hydrophilic transparent resin layer on a transparent substrate, (B) immersing it in a catalyst solution for electroless plating to disperse the catalyst into the hydrophilic transparent resin layer or the surface thereof, (C) rinsing the surface of the hydrophilic transparent resin layer including the catalyst with water, (D) immersing the substrate in an electroless plating bath to conduct electroless plating, thus forming a metal layer on the hydrophilic transparent resin layer and forming metal particles in the hydrophilic transparent resin layer, (E) forming a resist layer having a desired pattern on the metal layer, (F) removing the metal layer and the metal particles in the non-resist area by etching. In order to stably form the black region in the hydrophilic transparent layer by means of electroless plating, It is necessary to sufficiently conduct the water rinse. During the water rinse step, the catalyst concentration on the surface of the hydrophilic transparent layer decreases, which causes the effective deposition of the metal into the hydrophilic layer and leads to the stable production of the black region. It is an object of the present invention to provide a wide variety of materials with both shielding properties of electromagnetic wave and high visibility.

BRIEF EXPLANATION OF DRAWINGS

FIG. 2 shows two types of the catalyst concentration distribution perpendicular to the hydrophilic transparent resin layer after the water rinsing.

DETAILED DESCRIPTION OF THE INVENTION

Figure 1A:
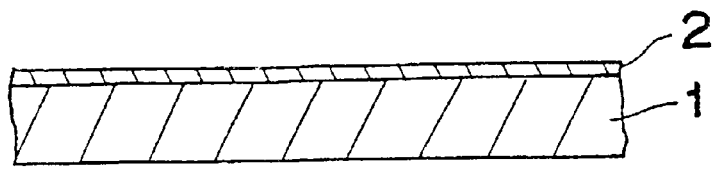
FIG. 1A to 1E are drawings which schematically show the process of producing the shielding material of the present invention.

The present invention relates to a material for shielding undesired electromagnetic irradiation, comprising a transparent substrate, a hydrophilic transparent resin layer and a metal mesh layer. As will be further described herein, the metal layer is formed by electroless-plating and the metal particles in the hydrophilic transparent resin layer are also formed by electroless plating. The black layer is formed from the fine metal particles dispersed in the hydrophilic transparent resin layer, which results in extremely low reflection of visible light. The present invention relates to the black region in the hydrophilic transparent resin layer having a dispersed distribution of fine particles of metal, and the method of stable formation of the black region in the hydrophilic transparent resin layer.

The present invention affords a shielding material having adequate adhesion to glass or acryl resin substrates that are generally used as display filters.

The process for producing the shielding material of the present invention is further explained with reference to FIG. 1A to FIG. 1E.

The preferable transparent substrates 1 used for the present invention are glass and acryl resin.

The hydrophilic transparent resin layer 2 is formed on the substrate 1 and is formed from hydrophilic transparent resin, of which examples are polyvinyl alcohol, acryl resin, cellulose and the like. Typical examples of the polyvinyl alcohols are ethylene-vinyl alcohol copolymer and vinylacetate-vinyl alcohol copolymer. Examples of the acryl resins are polyhydroxyethylacrylate, polyhydroxypropylacrylate, polyhydroxyethylmetacrylate, polyhydroxypropylmetacrylate, polyacrylamide, polymethylolacrylamide and their copolymer. Examples of the celluloses are nitrocellulose, and acethylpropylcellulose. The particularly preferred hydrophilic transparent resin which has adequate adhesion to the glass or acrylics substrate is a copolymer comprised of the following two monomer units represented by:

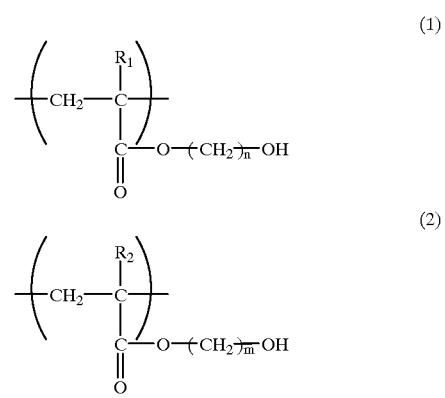

wherein $R_1$ and $R_2$ respectively represent a hydrogen atom or a methyl group, n represent 1 or 2 and m represent 3 or 4.

The hydrophilic transparent resin layer 2 is coated on the substrate mentioned above by a standard method such as dipping, roll and spin coating, and other general methods in the art. The hydrophilic transparent resin layer is formed from an aqueous solution of the hydrophilic resin. After coating the hydrophilic transparent resin, the coated substrate is dried and then immersed in an acidic aqueous solution of a catalyst for electroless plating.

Figure 1B:
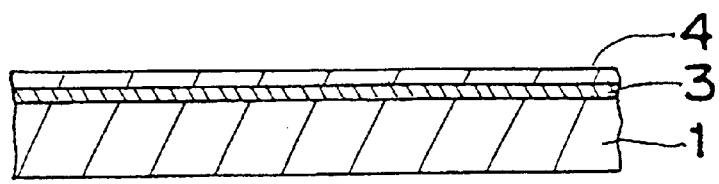
Figure 1C:
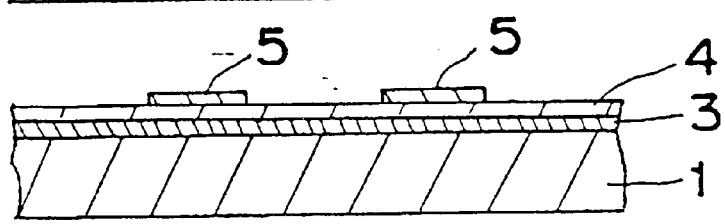
Figure 1D:
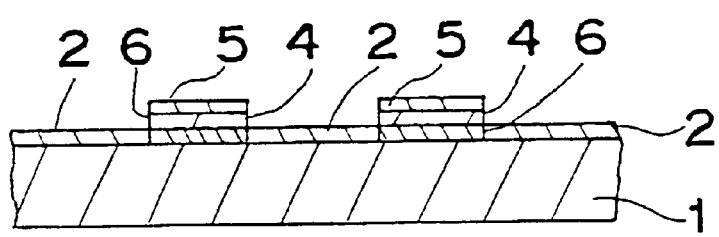

When the coated substrate is immersed in an acidic aqueous solution of catalyst, the hydrophilic transparent resin layer swells and absorbs the catalytic solution, and the catalyst is intercalated into the matrix of the hydrophilic transparent layer. In FIG. 1B, the hydrophilic transparent resin layer swelled with the catalyst solution is shown as 3.

The swelled substrate 1 is then rinsed with water to remove the excess of catalyst on the surface of and inside of the hydrophilic transparent resin layer. The distribution of the catalyst concentration in the direction of thickness in the hydrophilic transparent resin layer is very important for the stable formation of the black region after the water rinse. Accordingly, the rinse with water after the immersion of hydrophilic transparent resin layer is a very important process. In FIG. 2, two types of the catalyst concentration distribution perpendicular to the hydrophilic transparent resin layer after the water rinsing are shown. Type 1 in FIG. 2 shows a usual profile of the distribution of catalyst concentration being very high in the vicinity of the surface of the hydrophilic transparent resin layer. In this Type 1 case, the metal deposition onto the surface of the hydrophilic transparent resin layer occurs too much during the electroless plating step, which results in less formation of metal particles in the inside of the hydrophilic transparent layer. Type 2 depicts a particular distribution of the present invention that the catalyst concentration in the vicinity of the surface of hydrophilic transparent resin layer is relatively low and gradually decreases to the direction of the substrate, which results in the stable production of the black region. In the type 1 distribution of catalyst, since a large amount of catalyst is present in the vicinity of the surface of the hydrophilic transparent resin layer, the reduction of the metal ions in the plating bath rapidly occurs and the metal atoms are deposited on the surface area of the hydrophilic transparent resin layer to form the metal layer 4 very fast when the electroless plating is conducted. The supply of metal ions into the hydrophilic transparent resin layer is restricted by the presence of the metal layer formed during the electroless plating, and result in less formation of black region from fine metal particles in the hydrophilic transparent resin layer. To the contrary, since the type 2 distribution contains a little amount of catalyst in the vicinity of the surface of the hydrophilic transparent resin layer, the metal ions in the plating bath are continuously supplied into the inside of the hydrophilic transparent resin layer, and reduced to the fine metal particles which show black color.

The water rinsing has to be conducted enough to reduce the concentration of catalyst on or in the vicinity of the surface of the hydrophilic transparent resin layer. Thus, it is required to exhaustively conduct the water rinsing, because water rinsing which is conducted in usual conditions does not make it possible to form the type 2 distribution. According to the present invention, an exhaustive water rinsing such as 30 minutes immersion in the flowing water at 20° C. is needed. The rinse may be preferably conducted to reduce the concentration of catalyst at the surface of the hydrophilic transparent resin layer 3 to ½, more preferably to ⅓.

After rinsing, the hydrophilic transparent resin layer 3 containing the catalyst with type 2 distribution is immersed into an electroless plating bath at a controlled temperature. Preferred metal to be electrolessly plated includes copper, nickel, cobalt, gold, tin, and their metal alloy such as nickel-cobalt, nickel-cobalt-boron, nickel-cobalt-phosphor, nickel-tungsten-phosphor, cobalt-iron-phosphor, cobalt-tungsten-phosphor, cobalt-nickel-manganese-rhenium-phosphor.

Metal ions in the bath are reduced on or in the hydrophilic transparent resin layer by the function of the catalyst to form the metal layer 4 on the surface and to simultaneously form the fine metal particles therein. A space in the hydrophilic transparent resin matrix has a limitation and therefore, a particle size of plated metal particles is naturally limited. For the purpose of the black color formation in the hydrophilic transparent resin layer, it is necessary that the metal particle has a diameter of less than 1000 Å, preferably less than 500 Å. According to Mie's theory, a fine particle does not scatter visible light but absorbs it. When the diameter of metal particles in the matrix is less than 1000 Å, the incident light into the hydrophilic transparent resin layer from the direction of substrate is not scattered and rather absorbed by the deposited metal particles. Accordingly, the region of the dispersed fine metal particles shows black color.

In an initial period of electroless plating, the hydrophilic transparent resin layer on the light transmitting substrate gradually turns its color to dark because of the formation of fine metal particles dispersed in the hydrophilic transparent resin layer, and finally turns to black when the metal layer 4 is formed on the surface of the hydrophilic transparent resin layer. The metal layer 4 functions as a shielding layer of undesired electromagnetic wave, and the black region having the fine metal particles in hydrophilic transparent resin layer 3 functions as an anti-reflective layer.

Figure 1E:
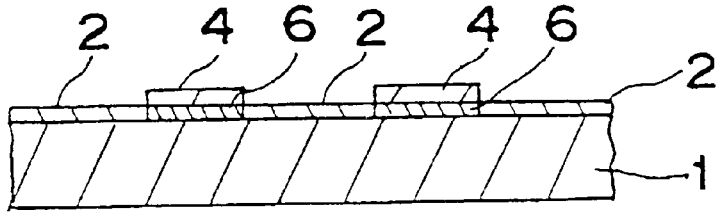

Next, the undesired portion of the metal layer and metal particles deposited are removed to form a pattern, as shown in FIG. 1E. The formation of the pattern is conducted by forming a resist layer 5 having the pattern on the metal layer 4 and then etching, with an etching solution, of the metal layer 4 and the fine metal particles. The resist pattern is determined so as not to damage the perspectiveness and electroconductivity of the shielding materials for EMI. The resist layer is formed by using printing or photographic methods which are known to the art.

The etching process removes the metal layer and the fine metal particles which are not covered with the resist layer 5. Consequently, the same pattern of black region as that of metal the layer is formed in the hydrophilic transparent resin layer. The removed portion of the metal layers and metal particles shows light transmitting property. Then, the resist part is, if necessary, removed in an appropriate manner. By the above-mentioned steps, the light transmitting materials of shielding EMI are realized with the desired electroconductive pattern.

An etching solution for etching the metal layer is known to the art. For example, ferric chloride is suitable for the etchant of nickel or copper.

If necessary, an anti-corrosive layer may be formed on the metal layer. The anti-corrosive layer may be formed by a plate treatment or chemical treatment, but chromate treatment is preferred because of its high corrosion resistance.

Alternatively, the pattern formation of the metal layer and metal particles can be conducted by another method. One is that the hydrophilic layer is selectively deposited in the area of a desired conductive pattern, and then electrolessly plated. Also, in the adsorption process of the plating catalyst, the catalyst may be selectively adsorbed in the hydrophilic transparent resin layer in the area of a desired conductive pattern by using a pre-forming method of the resist pattern. These methods are so effective that the etching process can be reduced, and the hydrophilic transparent resin and catalyst can be saved.

EXAMPLES

The present invention is further illustrated by the following Examples which, however, are not construed as limiting the present invention to their details.

Example 1

Transparent polymethylmetacrylate sheet was used as the substrate. The hydrophilic transparent resin layer was formed with a 1.5% methanol solution containing 100 parts of polyhydroxymethylmetacrylate and 10 parts of polyhydroxypropylmetacrylate by means of dip coating. The hydrophilic transparent resin layer had about 0.4 micron after drying for 0.5 hr at 70° C. The substrate was then immersed in a catalyst solution available under the name "A-30" from Okunoseiyaku, Co. Ltd. of Osaka, Japan for 5 minutes at 30° C. Exhaustive water rinse was conducted in a water bath containing distilled water by lifting up and down the substrate for 30 minutes at 20° C. Continuous removal of excess catalyst from the surface of the hydrophilic transparent layer leads to the suitable catalyst distribution as mentioned above. After an activation with acid and water rinse, the electroless plating of copper was conducted using a plating bath available under the name "OPC-700" from Qkunoseiyaku, Co. Ltd. for 7 minutes at 18° C. After forming the copper layer on the hydrophilic transparent resin layer, the substrate looked black from the opposite side. Additionally, using the conventional photolithography, that is, resist coating, UV exposure through a photo mask, development, and etching, the metal mesh pattern was formed. The black region uncovered with resist was etched in an acid etching process. After testing shielding effect, it was assured that the metal mesh with black portion had both high shielding and light transmitting ability.

Example 2

Transparent sodaglass sheet was used. Hydroxyethylacrylate-hydroxypropylacrylate copolymer was mixed in a mixed solvent of diacetone alcohol and dimethylformamide to form a 5% by weight solution which was then roll-coated on the transparent soda glass sheet to form a hydrophilic transparent resin layer. The hydrophilic transparent resin layer had about 1.2 micron after drying for 1 hr at 70° C. The substrate was then immersed in a catalyst solution available under the name "A-30" from Okunoseiyaku, Co. Ltd. of Osaka, Japan for 10 minutes at 30° C. Water rinse was conducted in the water bath containing distilled water by lifting up and down the substrate for 30 minutes at 20° C. After an activation with acid and water rinse, the electroless plating of copper was conducted using a plating bath available under the name "OPC-700" from Okunoseiyaku, Co. Ltd. for 9 minutes at 16° C. After forming the copper layer on the hydrophilic transparent resin layer, the substrate looked black from the opposite side. Additionally, using the conventional photolithography, that is, resist coating, UV exposure through a photo mask, development, and etching, the metal mesh pattern was formed. The black region uncovered with resist was etched in an acid etching process. After testing shielding effect, it was assured that the metal mesh with black portion had both high shielding and light transmitting ability.

Example 3

Transparent sodaglass sheet was used. Twenty parts by weight of hydroxyethylacrylate-hydroxypropylacrylate copolymer and 80 parts by weight of polyhydroxyethylacrylate were mixed in a mixed solvent of diacetone alcohol and dimethylformamide to form a 6% by weight solution which was then roll-coated on the transparent soda glass sheet to form a hydrophilic transparent resin layer. The hydrophilic transparent resin layer had about 1.2 micron after drying for 1 hr at 70° C. The substrate was then immersed in a catalyst solution available under the name "A-30" from Okunoseiyaku, Co. Ltd. of Osaka, Japan for 10 minutes at 30° C. Water rinse was conducted in the water bath containing distilled water by lifting up and down the substrate for 30 minutes at 20° C. After an activation with acid and water rinse, the electroless plating of copper was conducted using a plating bath available under the name "OPC-700" from Okunoseiyaku, Co. Ltd. for 9 minutes at 16° C. After forming the copper layer on the hydrophilic transparent resin layer, the substrate looked black from the opposite side. Additionally, using the conventional photolithography, that is, resist coating, UV exposure through a photo mask, development, and etching, the metal mesh pattern was formed. The black region uncovered with resist was etched in an acid etching process. After testing shielding effect, it was assured that the metal mesh with black portion had both high shielding and light transmitting ability.

Example 4

Transparent polymethylmethacrylate sheet was used.

Hundred parts by weight of polyhydroxyethylmethacrylate and 20 parts by weight of polyhydroxybutylacrylate were mixed in methanol to form a 2% by weight solution which was then dip-coated on the sheet to form a hydrophilic transparent resin layer. The hydrophilic transparent resin layer had about 0.5 micron after drying for 30 minutes at 70° C. The substrate was then immersed in a catalyst solution available under the name "A-30" from Okunoseiyaku, Co. Ltd. of Osaka, Japan for 10 minutes at 30° C. Water rinse was conducted in the water bath containing distilled water by lifting up and down the substrate for 30 minutes at 50° C. After an activation with acid and water rinse, the electroless plating of copper was conducted using a plating bath available under the name "OPC-700" from Okunoseiyaku, Co. Ltd. for 7 minutes at 18° C. After forming the copper layer on the hydrophilic transparent resin layer, the substrate looked black from the opposite side. Additionally, using the conventional photolithography, that is, resist coating, UV exposure through a photo mask, development, and etching, the metal mesh pattern was formed. The black region uncovered with resist was etched in an acid etching process. After testing shielding effect, it was assured that the metal mesh with black portion had both high shielding and light transmitting ability.

Example 5

Transparent polymethylmethacrylate resin sheet was used. A hydrophilic transparent resin layer was formed by dip-coating a 1.5% by weight methanol solution of polyhydroxyethylmethacrylate on the transparent resin sheet. The hydrophilic transparent resin layer had about 0.4 micron after drying for 30 minutes at 70° C. The substrate was then immersed in a catalyst solution available under the name "A-30" from Okunoseiyaku, Co. Ltd. of Osaka, Japan for 5 minutes at 30° C. Water rinse was conducted in the water bath containing distilled water by lifting up and down the substrate for 30 minutes at 20° C. After an activation with acid and water rinse, the electroless plating of copper was conducted using a plating bath available under the name "OPC-700" from Okunoseiyaku, Co. Ltd. for 7 minutes at 18° C. After forming the copper layer on the hydrophilic transparent resin layer, the substrate looked black from the opposite side. Additionally, using the conventional photolithography, that is, resist coating, UV exposure through a photo mask, development, and etching, the met,a mesh pattern was formed. The black region uncovered with resist was etched in an acid etching process. After testing shielding effect, it was assured that the metal mesh with black portion had both high shielding and light transmitting ability.

The test of visibility was conducted on the shield material obtained in Examples 1–5 by applying the material to a display and evaluating the visibility by eye. Evaluation was GOOD for no reflection of back scenery and the clear image of the display resulted by the formation of the black region in the hydrophilic transparent resin layer, and BAD for the presence of reflection and not clear image of the display.

Comparative Example 1

A shield material was obtained as generally described in Example 1, with the exception that the water rinsing was conducted in water by lifting up and down at 20° C. for 2 minutes.

The result of the test of visibility of Comparative Example 1 was "BAD", because of the reflection of back scenery and the lack of clear image of the display resulted by the inadequate formation of the black region in the hydrophilic transparent resin layer.

Cross-cut tests for the evaluation of the adhesive force of the hydrophilic transparent resin layer to the substrate conducted to Examples 1–5 show 100/100, means strong adhesion, for Examples 1–4, but 10/100, means poor adhesion, for Example 5 having the different part that was the hydrophilic transparent resin comprised 1.5% polyhydroxyethylmetacryrate solution of methanol.

What is claimed is:

1. A transparent material for shielding undesired electromagnetic wave, comprising:
   (a) a transparent substrate,
   (b) a hydrophilic transparent resin layer formed on the transparent substrate (a), which in certain areas contains finely dispersed therein to form a black region and in the other area does not contain metal particles to form a transparent region, and
   (c) a metal layer formed on the black region in the hydrophilic transparent resin layer (b).

2. The transparent material for shielding undesired electromagnetic wave according to claim 1 wherein said transparent substrate (a) is made from or acrylic resin.

3. The transparent material for shielding undesired electromagnetic wave according to claim 1 wherein said hydrophilic transparent resin layer (b) is formed from a polymer having two repeating units represented by:

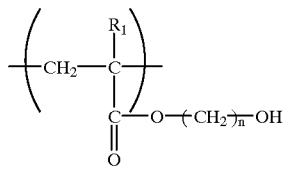
(1)

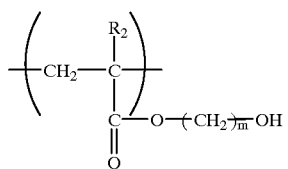
(2)

wherein $R_1$ and $R_2$ respectively represent a hydrogen atom or a methyl group, n represents 1 or 2 and m represents 3 or 4.

4. The transparent material for shielding undesired electromagnetic wave according to claim 1 wherein said metal particles present in the hydrophilic transparent resin layer (b) are formed by electroless plating.

5. The transparent material for shielding undesired electromagnetic wave according to claim 1 wherein said metal layer (c) is formed by electroless plating.

6. The transparent material for shielding undesired electromagnetic wave according to claim 1 wherein said metal particles have a diameter of not more than 1,000 Å.

7. A process for producing a transparent material for shielding undesired electromagnetic wave, comprising:

(A) forming a hydrophilic transparent resin layer on a transparent substrate, (B) immersing it in a catalyst solution for electroless plating to disperse the catalyst into the hydrophilic transparent resin layer or the surface thereof, (C) rinsing the surface of the hydrophilic transparent resin layer including the catalyst with water, (D) immerse the substrate in an electroless plating bath to conduct electroless plating, thus forming a metal layer on the hydrophilic transparent resin layer and forming metal particles in the hydrophilic transparent resin layer, (E) forming a resist layer having a desired pattern on the metal layer, (F) removing the metal layer and the metal particles in the non-resist area by etching.

8. The process according to claim 7 wherein said transparent substrate is made from glass or acrylic resin.

9. The process according to claim 7 wherein said hydrophilic transparent resin layer is formed from the polymer having two repeating units represented by:

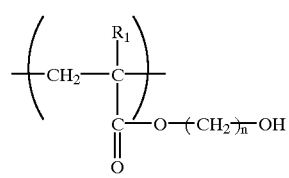
(1)

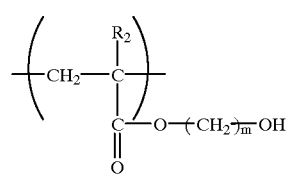
(2)

wherein $R_1$ and $R_2$ respectively show a hydrogen atom or a methyl group, n shows 1 or 2 and m shows 3 or 4.

10. The process according to claim 7 wherein said metal particles has a diameter of not more than 1,000 Å.

11. The process according to claim 7 wherein the rinsing in the step (C) is conducted enough to reduce less than half a concentration of the catalyst for electroless plating on the surface of the hydrophilic transparent resin layer.

* * * * *